United States Patent [19]
Kobayashi et al.

[11] Patent Number: 6,043,586
[45] Date of Patent: Mar. 28, 2000

[54] VIBRATION ACTUATOR

[75] Inventors: Mina Kobayashi; Michihiro Tobe, both of Yokohama; Tunemi Gonda, Yamato, all of Japan

[73] Assignee: Nikon Corporation, Tokyo, Japan

[21] Appl. No.: 08/840,241

[22] Filed: Apr. 11, 1997

[30] Foreign Application Priority Data

| Apr. 11, 1996 | [JP] | Japan | 8-089622 |
| Mar. 27, 1997 | [JP] | Japan | 9-074800 |

[51] Int. Cl.⁷ .................................................. H02N 2/00
[52] U.S. Cl. ............................. 310/323.09; 310/323.16
[58] Field of Search ........................... 310/328, 321, 310/323, 323.01, 323.16, 323.09

[56] References Cited

U.S. PATENT DOCUMENTS

| 5,039,899 | 8/1991 | Yamaguchi | 310/323 |
| 5,101,132 | 3/1992 | Yamaguchi | 310/323 |
| 5,136,200 | 8/1992 | Takizawa et al. | 310/323 |
| 5,140,215 | 8/1992 | Yamaguchi | 310/323 |
| 5,191,688 | 3/1993 | Takizawa et al. | 310/323 |
| 5,200,665 | 4/1993 | Iijuma | 310/323 |
| 5,416,375 | 5/1995 | Funakubo et al. | 310/323 |
| 5,698,930 | 12/1997 | Takagi | 310/323 |
| 5,818,147 | 10/1998 | Kobayashi et al. | 310/323 |
| 5,821,670 | 10/1998 | Tobe et al. | 310/328 |

FOREIGN PATENT DOCUMENTS

| 63-154077 | 6/1988 | Japan | 310/323 |
| 63-277477 | 11/1988 | Japan | 310/323 |
| 6-105571 | 4/1994 | Japan | 310/323 |
| 6-121556 | 4/1994 | Japan | 310/328 |
| 7-143771 | 6/1995 | Japan | H02N 2/00 |

OTHER PUBLICATIONS

U.S. application No. 08/595,450, U.S. Pat. No. 5,698,930, Tadao Takagi, filed Feb. 5, 1996, Nikon Corporation.

Piezoelectric Linear Motors for Application to Driving a Light Pick–Up Element, (Mr. Yoshiro Tomikawa et al., 5th Electromagnetic Force Related Dynamics Symposium, Collected Papers, Jun. 9–11, 1993, pp. 393–398) (with English abstract).

Ultrasonic Motors, Theory and Applications, S. Ueha, Y. Tomikawa, M. Kurosawa, N. Nakamura, Clarendon Press, Oxford, 1993, all pages.

*Primary Examiner*—Thomas M. Dougherty

[57] ABSTRACT

A vibration actuator produces a driving force by generating elliptic motion in the surface of an elastic member through electromechanical converting elements. The vibration actuator then generates relative motion between the elastic member and a relative moving member which is in compressive contact with the elastic member The electro-mechanical converting elements, in the form of piezoelectric elements, generate longitudinal vibrations and bending vibrations in the elastic member. The elastic member has a rectangular plate shape and includes a plurality of driving force output units which contact the relative moving member. Plural sliding members are respectively mounted on portions of the plurality of driving force output units such that the sliding members do not fully extend across the driving force output units in a short side direction.

15 Claims, 9 Drawing Sheets

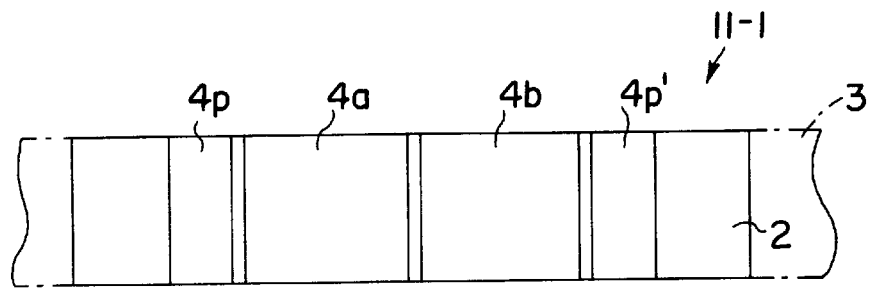
FIG. 3A
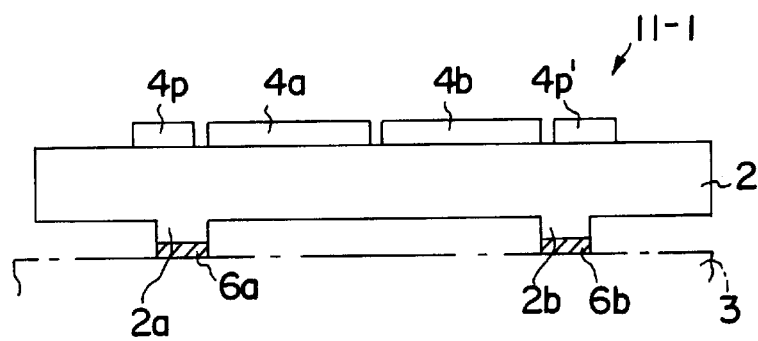 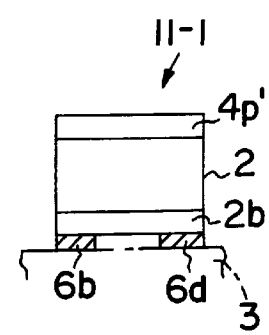
FIG. 3B   FIG. 3C
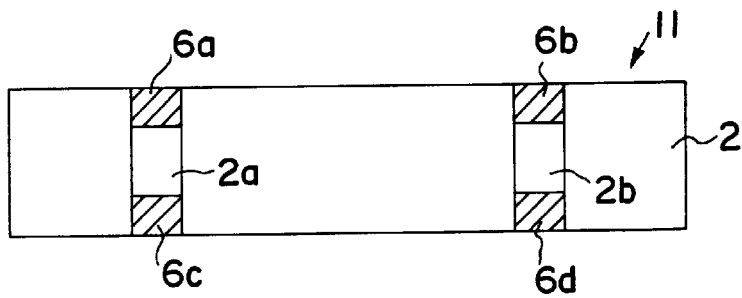
FIG. 3D

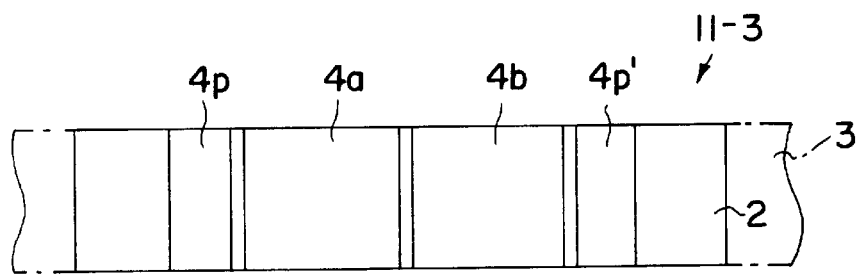
FIG.5A
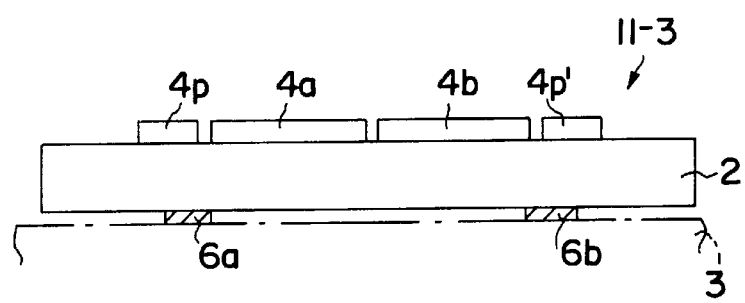 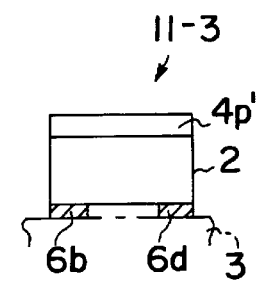
FIG.5B  FIG.5C
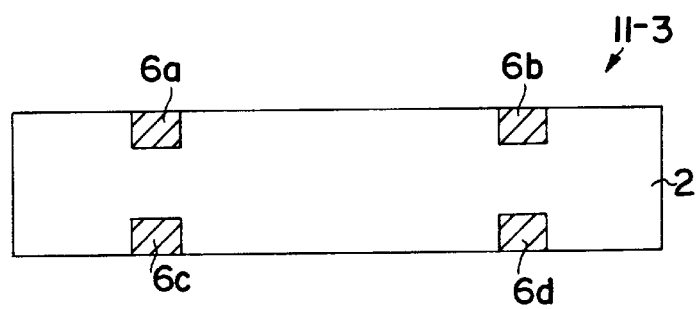
FIG.5D

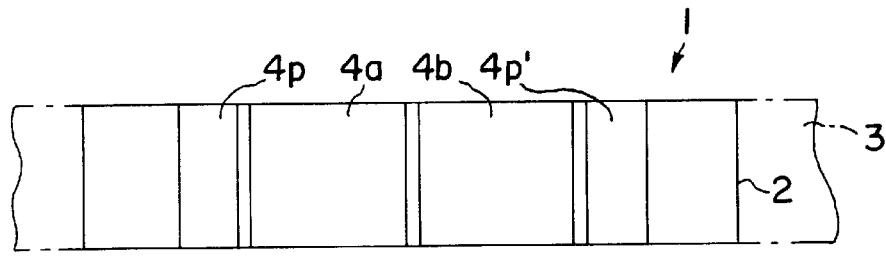
FIG. 9A
PRIOR ART
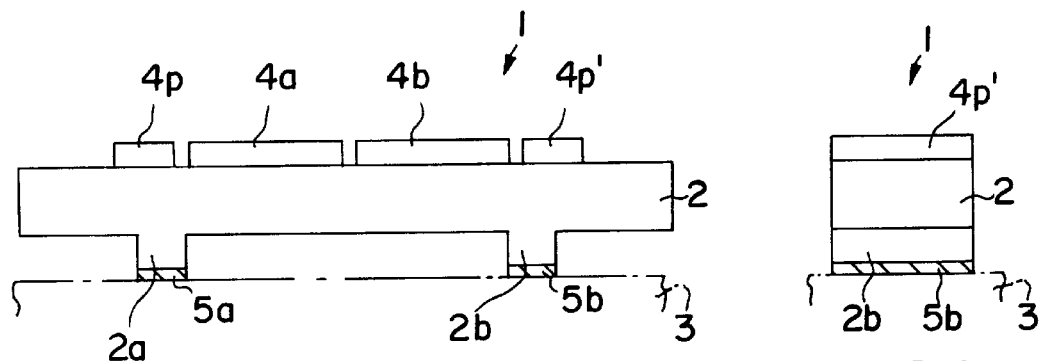
FIG. 9B
PRIOR ART
FIG. 9C
PRIOR ART
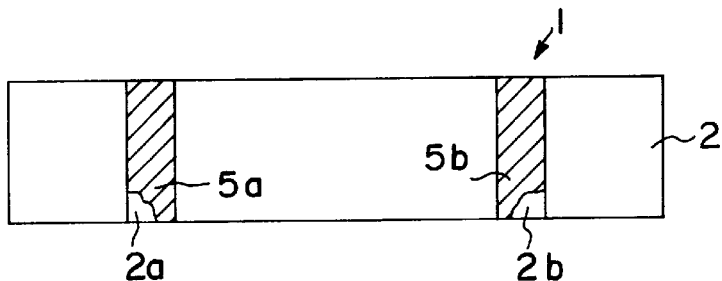
FIG. 9D
PRIOR ART

VIBRATION ACTUATOR

CROSS-REFERENCE TO RELATED APPLICATIONS

This application is based upon and claims priority of Japanese Patent Application Numbers 08-089622 filed Apr. 11, 1996 and 09-074800, filed Mar. 27, 1997, the contents being incorporated herein by reference.

BACKGROUND OF THE INVENTION

The present invention relates to vibration actuators. More particularly, the present invention relates to vibration actuators which generate a driving force through elliptic motion in a surface of an elastic member.

Elliptic motion in a vibration actuator results from excitation of an elastic member by an electro-mechanical converting element. Relative motion is then produced between the elastic member and a relative moving member which is in compressive contact with the elastic member.

Conventional vibration actuators cause multiple vibrations of an elastic member by impressing alternating electric currents onto electro-mechanical converting elements which are attached to the elastic member. The construction and load characteristics of a conventional vibration actuator are described in "Piezoelectric Linear Motor Intended for Optical Pickup Movement" (Mr. Yoshiro Tomikawa et al., 5th Electromagnetic Force Related Dynamics Symposium, Collected Papers, 1993, pp. 393–398).

FIGS. 9A–9D illustrate a conventional vibration actuator 1. FIG. 9A is a top view, FIG. 9B is a front view, FIG. 9C is a right side view, and FIG. 9D is a bottom view. Vibration actuator 1 is in the form of a rectangular parallelepiped, however a rectangular plate form is particularly illustrated in the figures. Vibration actuator 1 includes an elastic member 2 which includes driving force output units 2a, 2b formed as projections on a first flat surface of elastic member 2. A relative moving member 3 is in compressive contact with elastic member 2 via driving force output units 2a, 2b and a compression mechanism (not shown). Driving force output units 2a, 2b are respectively formed at two locations which are close to antinode positions of a fourth order bending vibration generated in elastic member 2. A number of materials may be used for the construction of elastic member 2, including stainless steel, aluminum alloy and like metallic materials, or plastic materials.

Piezoelectric elements 4a, 4b, 4p, 4p' are affixed to a second flat surface of elastic member 2 opposite to the first flat surface. The piezoelectric elements are electro-mechanical converting elements in the form of rectangular thin sheets.

Piezoelectric elements 4a and 4b are drive elements for generating bending vibrations and longitudinal vibrations in elastic member 2. Piezoelectric elements 4p, 4p' are mechano-electric converting elements which detect a vibrational state generated in elastic member 2. Lead wires (not shown) are soldered to piezoelectric elements 4p, 4p', and are similarly connected to a control circuit (not shown).

When alternating voltages, which are drive signals from a drive voltage generating device (not shown) are impressed onto piezoelectric elements 4a, 4b, first order longitudinal vibrations and fourth order bending vibrations are generated in elastic member 2. As a result, when relative moving member 3 is in compressive contact with elastic member 2, via driving force output units 2a, 2b, relative motion is generated with respect to elastic member 2. This relative motion is then used as an output force for driving an exterior unit.

In vibration actuator 1, respective fixed frequencies of a first order longitudinal vibration and a fourth order bending vibration are set such that they become very close or are set to the same value. Accordingly, by impressing alternating voltages having two close, fixed frequencies, onto piezoelectric elements 4a, 4b, respectively, a first order longitudinal vibration and a fourth order bending vibration are harmonically generated.

End surfaces of driving force output units 2a, 2b are formed as projections and respectively support sliding members 5a, 5b. Sliding members 5a, 5b are affixed onto the entire end surfaces of driving force output units 2a, 2b in order to reduce a sliding resistance with relative moving member 3. Conventional sliding members 5a, 5b are uniformly formed by affixing plastic, metal plating, or a melted coating of inorganic materials and the like. FIG. 9C particularly illustrates sliding members 5a, 5b with a portion broken away.

However, in vibration actuator 1 illustrated in FIGS. 9A–9D, even if careful attention is paid to the optimal selection and affixing of sliding members 5a, 5b, slip arises between the sliding members 5a, 5b and relative moving member 3 during driving. Because of this, sliding noise is generated by the sliding members. This presents a problem because silent operation is an important characterizing feature of vibration actuators. The generation of this type of sliding noise also limits an optimum range of vibration actuator 1 and is one of the problems that needs to be solved.

Furthermore, the energy of the longitudinal vibrations and bending vibrations generated in elastic member 2 is transmitted to relative moving member 3 via sliding members 5a, 5b. Thus, generation of this type of slip reduces drive efficiency of vibration actuator 1.

BRIEF SUMMARY OF THE INVENTION

It is therefore an object of the present invention to solve the above-mentioned problems by providing a vibration actuator which reduces slip arises during driving.

It is a further object of the present invention to generate plural vibrations in an elastic member of a vibration actuator by locating a plurality of sliding members in a center portion of respective driving force output members.

It is still a further object of the present invention to generate plural vibrations including bending vibrations in a vibration actuator by forming a plurality of sliding members close to positions of antinodes of the bending vibration.

It is still a further object of the present invention to form a plurality of driving force output units of a vibration actuator in at least two places along a relative motion direction of an elastic member.

It is still a further object of the present invention to arrange a plurality of sliding members for a vibration actuator in positions in which travel paths does not mutually overlap.

Objects of the invention are achieved by a vibration actuator including an elastic member of rectangular parallelepipedal form having a first and second face; an electro-mechanical converting element mounted to the first face of the elastic member and to generate plural vibrations in said elastic member; plural driving force output portions formed on the second face of the elastic member and extending in a short side direction of the second face of the elastic member; a relative moving member in compressive contact with the driving force output portions; and plural sliding members respectively disposed on the driving force output portions such that the sliding members do not fully extend across the driving force output portions in the short side direction.

Further objects of the invention are achieved by a vibration actuator including an elastic member having a first and second face; an electro-mechanical converting element attached to the first face of the elastic member to generate elliptic motion in the elastic member; a relative moving member to move with respect to the elastic member in response to the elliptic motion; and plural sliding members mounted on the elastic member in positions where the amplitude of the elliptic motion becomes approximately equal.

Moreover, objects of the invention are achieved by a vibration actuator, including an elastic member having a first face and second face, wherein the first and second face extend in a short side direction and a long side direction; an electro-mechanical converting element mounted on the first face of the elastic member to generate plural vibrations in the elastic member; a first pair of sliding members extending from the second face of the elastic member and separated in the short side direction; a second pair of sliding members extending from the second face of the elastic member and separated in the short side direction, wherein the second pair of sliding members are separated from the first pair of sliding members in a long side direction; and a relative moving member in compressive contact with the first and second pair of sliding members.

BRIEF DESCRIPTION OF THE DRAWINGS

These and other objects and advantages of the invention will become apparent and more readily appreciated from the following description of the preferred embodiments, taken in conjunction with the accompanying drawings of which:

FIGS. 3A–3D are respective top, front, right side, and bottom views of a vibration actuator according to a second preferred embodiment of the present invention.

FIGS. 5A–5D are respective top, front, right side, and bottom views of a vibration actuator according to a fourth preferred embodiment of the present invention.

FIGS. 9A–9D (PRIOR ART) are respective top, front, right side, and bottom views of a conventional vibration actuator.

DETAILED DESCRIPTION OF THE PREFERRED EMBODIMENTS

Figure 1A:
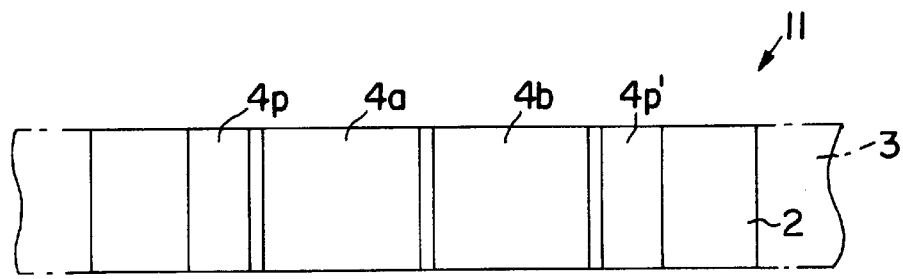
FIGS. 1A–1D are respective top, front, right side, and bottom views of a vibration actuator according to a first preferred embodiment of the present invention.

Reference will now be made in detail to the preferred embodiments of the present invention, examples of which are illustrated in the accompanying drawings, wherein like reference numerals refer to like elements throughout.

First Embodiment

Preferred embodiments of the present invention are described in detail hereinbelow with reference to the accompanying drawings. The descriptions of the following preferred embodiments of the present invention are vibration actuators in the form of ultrasonic actuators which vibrate in an ultrasonic vibration region.

Figure 1B:
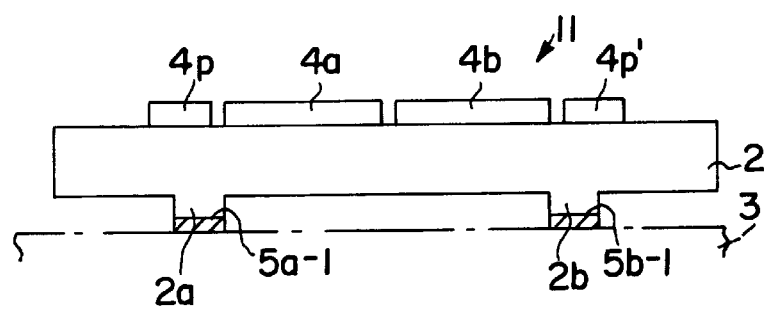
Figure 1C:
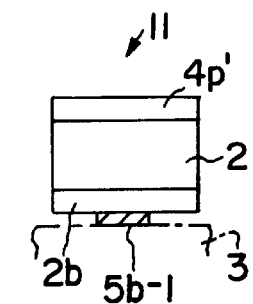
Figure 1D:
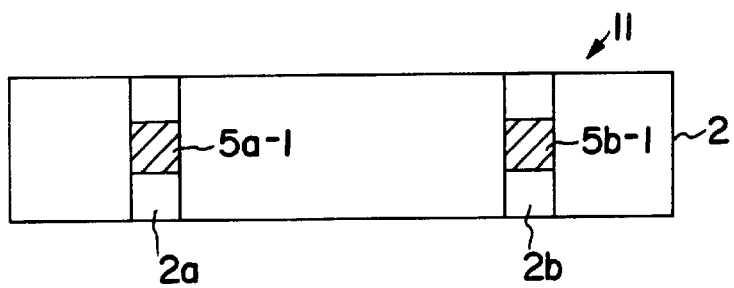

FIGS. 1A–1D illustrate the construction of a vibration actuator 11 according to a first preferred embodiment of the present invention. FIG. 1A is a top view, FIG. 1B is a front view, FIG. 1C is a right side view, and FIG. 1D is a bottom view.

A point of difference between vibration actuator 11 of the first preferred embodiment and vibration actuator 1 illustrated in FIGS. 9A–9D is the mounting position of sliding members 5a, 5b. Other portions which are in common with the conventional embodiment of FIGS. 9A–9D have been given the same symbols, and duplicate descriptions are omitted.

Elastic member 2 of vibration actuator 11 includes piezoelectric elements 4a, 4b, 4p, 4p' mounted on a first flat surface (hereinbelow "first face"). Moreover, driving force output units 2a, 2b are formed on a second surface (hereinbelow "second face") opposite to the first face. Sliding members 5a-1, 5b-1 are mounted in an approximate central portion of respective driving force output units 2a, 2b in a short side direction across the second face of elastic member 2. Hereinafter the short side direction shall refer to the direction across a short side of elastic member 2. Sliding members 5a-1 and 5b-1 do not cover a whole end surface of relative moving member 3. Moreover, sliding members 5a-1, 5b-1, as illustrated, have an approximately square flat surface shape and are affixed to driving force output units 2a, 2b by adhesion.

Figure 2B:
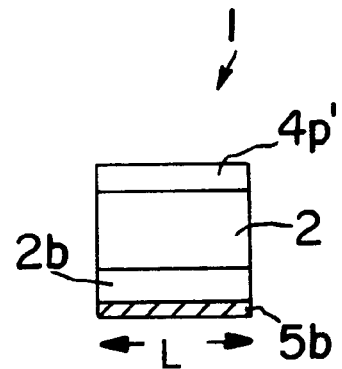
FIG. 2B is a right side view of a vibration actuator having an amplitude of elliptic motion illustrated in the graph of FIG. 2A.
Figure 2A:
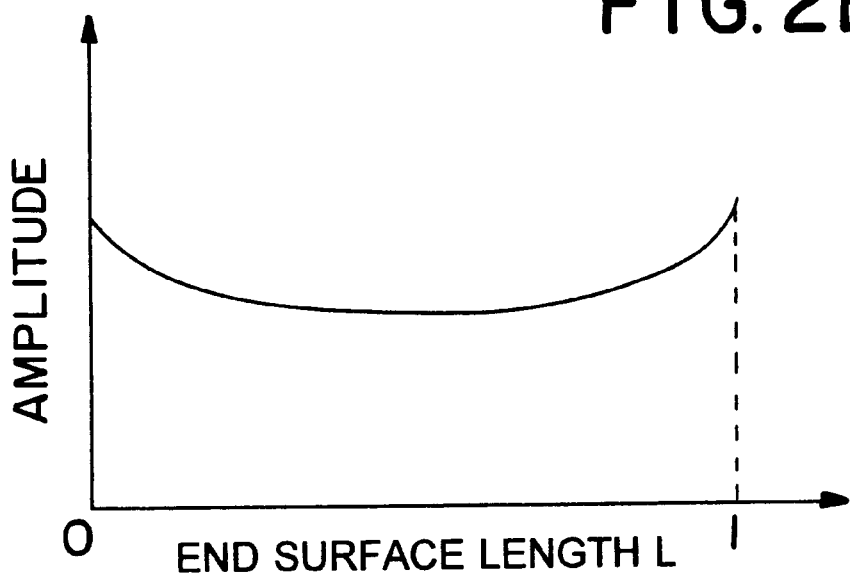
FIG. 2A is a graph illustrating amplitude of elliptic motion generated in an end surface of a driving force output unit according to a preferred embodiment of the present invention.

FIG. 2A illustrates a graphic result of analyzing the amplitude of elliptic motion which is generated in end surfaces of driving force output units 2a, 2b, in relation to position in the short side direction of elastic member 2, i.e. a length direction L across driving force output units 2a, 2b on the second face of elastic member 2.

As illustrated, amplitude is represented by a curve which becomes a maximum at both end sides in the short side direction across the second face of elastic member 2, and becomes a minimum in a center portion. Because of this, when vibration actuator 1 is driven, sliding members 5a, 5b and relative moving member 3 are not uniformly in contact. That is, strong contact occurs at the center portion of the elastic member and slip occurs at both end sides.

According to the first preferred embodiment, sliding members 5a-1, 5b-1 are mounted within a range in which an amplitude of elliptic motion arising in driving force output units 2a, 2b becomes approximately constant. Thus, in vibration actuator 11 of FIG. 1, relative moving member 3 contacts driving force output units 2a, 2b in a range in which amplitude within driving force output units 2a, 2b is approximately constant. Because of this, surface pressure of a contact portion of relative moving member 3 and sliding members 5a, 5b is approximately constant.

According to the first preferred embodiment of the present invention, slip between driving force output units 2a, 2b and relative moving member 3 is eliminated or markedly reduced. Thus, sliding noise is not generated during driving of vibration actuator 11 and operation becomes more quiet. Moreover, efficiency of vibration transmission from elastic member 2 to relative moving member 3 is increased and drive efficiency is increased.

Because the mounting area of sliding members 5a-1, 5b-1 is reduced, a contact area between sliding members 5a-1, 5b-1 and relative moving member 3 becomes smaller than in the prior art. Thus, processing to maintain dimensional accuracy of the mounting surface of sliding members 5a, 5b can be easily performed. The state of compression of elastic member 2 and relative moving member 3 can also be made uniform. Accordingly, a state of contact of elastic member 2 and relative moving member 3 is stabilized and the driving of vibration actuator 11 is also stabilized.

Through operation of vibration actuator 11, according to the first preferred embodiment, when amplitude differs according to position in a short side direction of the second face of elastic member 2, slip with respect to relative moving member 3 is eliminated. As a result, generation of sliding noise and a reduction in drive efficiency are eliminated.

Moreover, through operation of vibration actuator 11, according to the first preferred embodiment of the present invention, a width of sliding members 5a-1, 5b-1 is made smaller than a width of elastic member 2, and it is possible to easily maintain parallelism of the contact surfaces of driving force output units 2a, 2b. Thus, it is possible to suppress a respective reduction of driving torque and drive efficiency which accompany an occurrence of slip between driving force output units 2a, 2b and relative moving member 3.

Second Embodiment

As set forth below, vibration actuator 11-1 is described according to a second preferred embodiment of the present invention. Furthermore, in a description of each embodiment set forth hereafter, a description is given in terms of a difference from vibration actuator 11 of the first preferred embodiment. Accordingly, like portions are given like symbols in the drawings and duplicate descriptions are omitted.

FIGS. 3A–3D are respective top, front, right side, and bottom views of a vibration actuator 11-1 according to a second preferred embodiment of the present invention.

A point in which vibration actuator 11-1 of the second preferred embodiment and vibration actuator 11 of the first preferred embodiment differ is in a mounting position of respective sliding members. According to the second preferred embodiment, sliding members 6a–6d, having an approximate square shape, are mounted at both end portions, i.e. the side of driving force output units 2a, 2b. Sliding members 6a–6d are not mounted as in the first preferred embodiment.

As illustrated, a mounting position for sliding members of the third preferred embodiment, in comparison with vibration actuator 11 of the first preferred embodiment, is in a position in which an amount of change in amplitude is large according to a difference in position. See FIG. 2A. Because of this, there is a disadvantage from a standpoint of stability of contact. However, because of mounting on both end portion sides in a length direction of driving force output units 2a, 2b, stability accompanying compression is markedly increased.

Also, by way of the second preferred embodiment, in comparison with a prior art case of mounting sliding members about an entire surface of driving force output units 2a, 2b, an amount of slip is greatly reduced. Accordingly, generation of a sliding noise and a reduction in efficiency of drive are both markedly improved.

Third Embodiment

FIGS. 4A–4D are respective top, front, right side, and bottom views of a vibration actuator 11-2 according to a third preferred embodiment of the present invention. Vibration actuator 11-2 of the third preferred embodiment is similar to the above second preferred embodiment on a plane of the second face. However, driving force output units 2a, 2b are not formed with a projecting shape as in vibration actuator 11 of the first preferred embodiment. In other words, driving force output units having a zero height are disposed at two positions on elastic member 2 close to the positions of antinodes of the bending vibration. Because the driving force output members have a zero height, they are not particularly illustrated in FIGS. 4A–4D with the designation of a reference numeral. Sliding members 5a-1, 5b-1 are mounted onto these driving force output units.

According to the third preferred embodiment of the present invention, vibration actuator 11-2 does not generate sliding noise and drive efficiency is high. Moreover, because manufacturing processes to form the driving force output units in a projecting form on one side of elastic member 2 are unnecessary, manufacture becomes simplified.

Fourth Embodiment

Figure 4A:
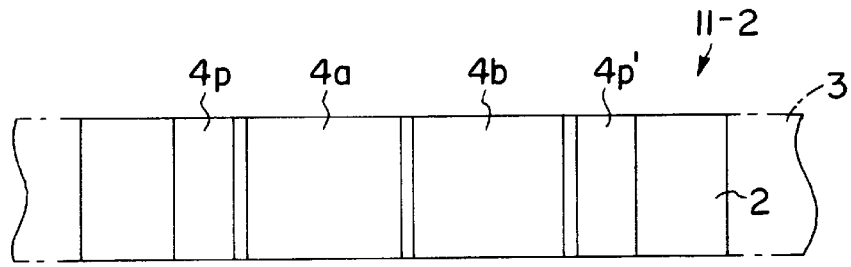
FIGS. 4A–4D are respective top, front, right side, and bottom views of a vibration actuator according to a third preferred embodiment of the present invention.
Figure 4B:
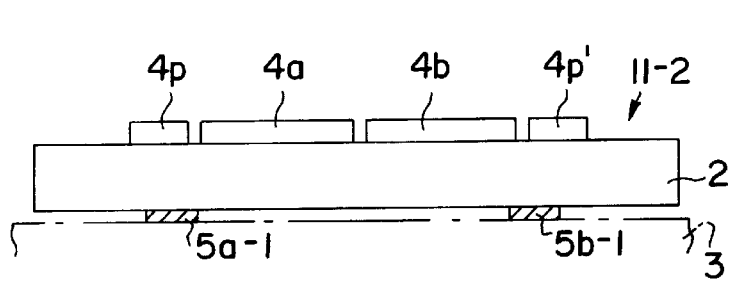
Figure 4C:
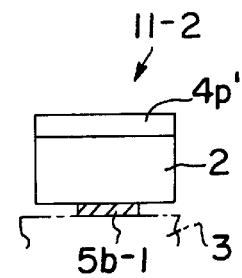
Figure 4D:
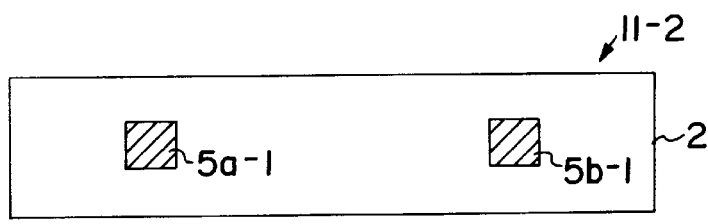

FIGS. 5A–4D are respective top, front, right side, and bottom views of a vibration actuator 11-3 according to a fourth preferred embodiment of the present invention. Vibration actuator 11-3, according to the fourth preferred embodiment, is also similar to the second preferred embodiment on a plane of the second face. However, driving force output units 2a, 2b are not formed with a projecting shape as in vibration actuator 11 of the first preferred embodiment. In other words, driving force output units of zero height are disposed at two positions close to positions of antinodes of the bending vibration, and sliding members 6a–6d are mounted onto these driving force output units. Driving force output units 2a, 2b are not particularly illustrated in the figures because they have a zero height.

The fourth preferred embodiment is similar to the second preferred embodiment in that vibration actuator 11-3 does not generate sliding noise and drive efficiency is high. Moreover, because manufacturing processes to form the driving force output units in a projecting form on one side of the elastic member 2 are unnecessary, manufacture becomes simplified.

Fifth Embodiment

Figure 6A:
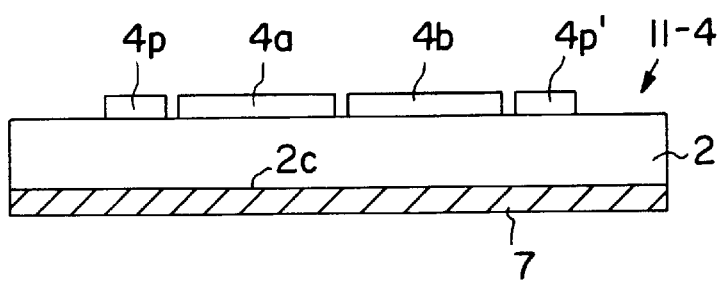
FIGS. 6A and 6C are respective front and right side views of a vibration actuator in a first manufacturing stage according to a fifth preferred embodiment of the present invention.
Figure 6C:
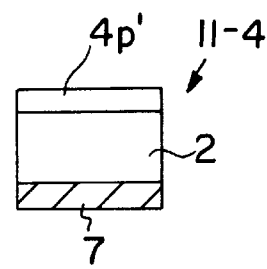
Figure 6B:
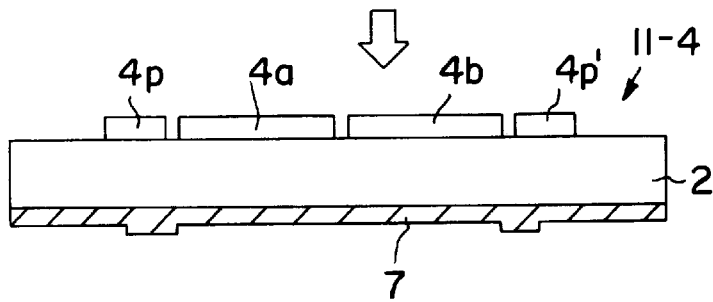
FIGS. 6B and 6D are respective front, and right side views of a vibration actuator in a second, alternative, manufacturing stage according to a fifth preferred embodiment of the present invention.

FIGS. 6A–6C are respective front, and right side views of a first manufacturing stage of a vibration actuator 11-4 according to a fifth preferred embodiment of the present invention. Vibration actuator 11-4 according to the fifth preferred embodiment includes driving force output units which are integral with sliding members.

As illustrated in FIG. 6A, elastic member 2 is provided with a flat surface 2c, i.e. a second face, which forms driving force output units as a flat surface. In a first step of manufacture, resin sheet 7 is preferably made of POLY-FLON and is affixed over an entire surface of flat surface 2c by way of an epoxy type adhesive. Then, as illustrated in FIG. 6B, portions other than those remaining at just two positions close to antinodes of the bending vibration generated in the elastic member 2 are eliminated in a second stage of manufacture. Driving force output units are then constituted integrally with respective sliding members.

Figure 6D:
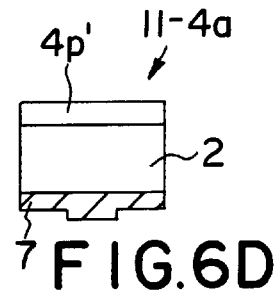
Figure 6E:
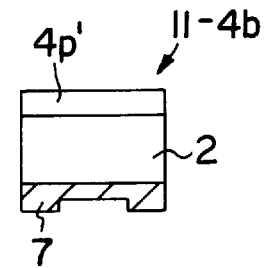
FIG. 6E is a right side view of a vibration actuator in a second manufacturing stage according to a fifth preferred embodiment of the present invention.

Moreover, as illustrated in FIGS. 6D and 6E, the configuration of resin sheet 7 may be changed to eliminate different portions thereof. By eliminating portions from resin sheet 7, vibration actuators 11-4a and 11-4b, as illustrated respectively in FIGS. 6D and 6E, may be produced in accordance with the preferred embodiments of the present invention.

By way of the fifth preferred embodiment, installation of sliding members by bonding resin sheet 7 to elastic member 2 becomes very simple, and productivity of vibration actuator 11-4 can be improved.

Sixth Embodiment

FIGS. 7A–7D are respective side views illustrating manufacturing stages of a vibration actuator 11-5 according to a sixth preferred embodiment of the present invention. Vibration actuator 11-5 of the sixth preferred embodiment is similar to the vibration actuator of the first preferred embodiment. However, vibration actuator 11-5 differs in a method of forming the sliding members onto driving force output units 2a, 2b.

Figure 7A:
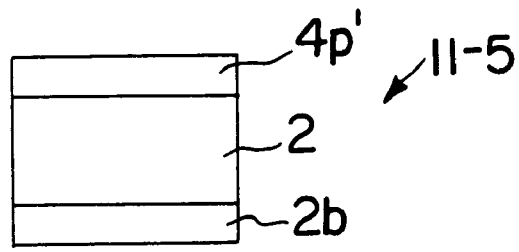
FIGS. 7A–7D are respective side views illustrating manufacturing stages of a vibration actuator according to a sixth preferred embodiment of the present invention.
Figure 7B:
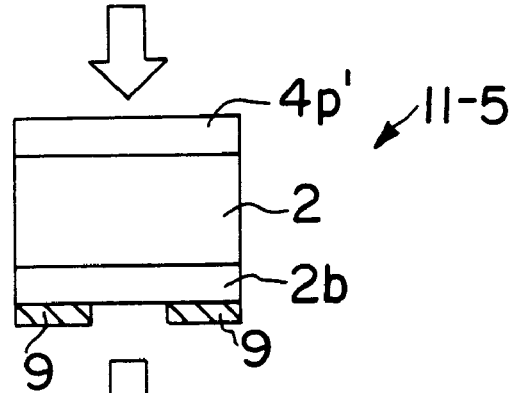

As illustrated in FIG. 7A, elastic member 2 includes driving force output units 2a, 2b formed onto a bottom surface thereof. Next, as illustrated in FIG. 7B, a coating film 9 is formed on both end portions in a short side direction of elastic member 2 by applying coating material to driving force output units 2a, 2b. Coating film 9 has a masking role, and the masking may be performed with adhesive tape.

Figure 7C:
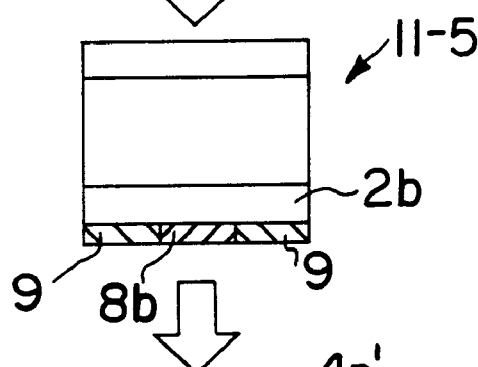
Figure 7D:
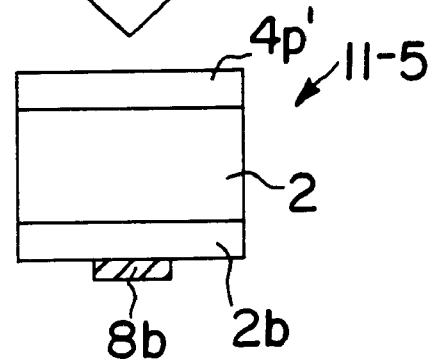

Next, as illustrated in FIG. 7C, sliding members 8a, 8b (because FIG. 7C is a right side view, sliding member 8a is not shown) are formed as thin films by surface treatment (for example, alumite treatment) using plating or melt coating, etc. Sliding member 8a, 8b are formed on elastic member 2 which has been masked. Next, as illustrated in FIG. 7D, coating film 9 is removed.

Thus, sliding members 8a, 8b can be formed very simply in the above manner as thin films on the bottom surfaces of driving force output units 2a, 2b.

Seventh Embodiment

Figure 8:
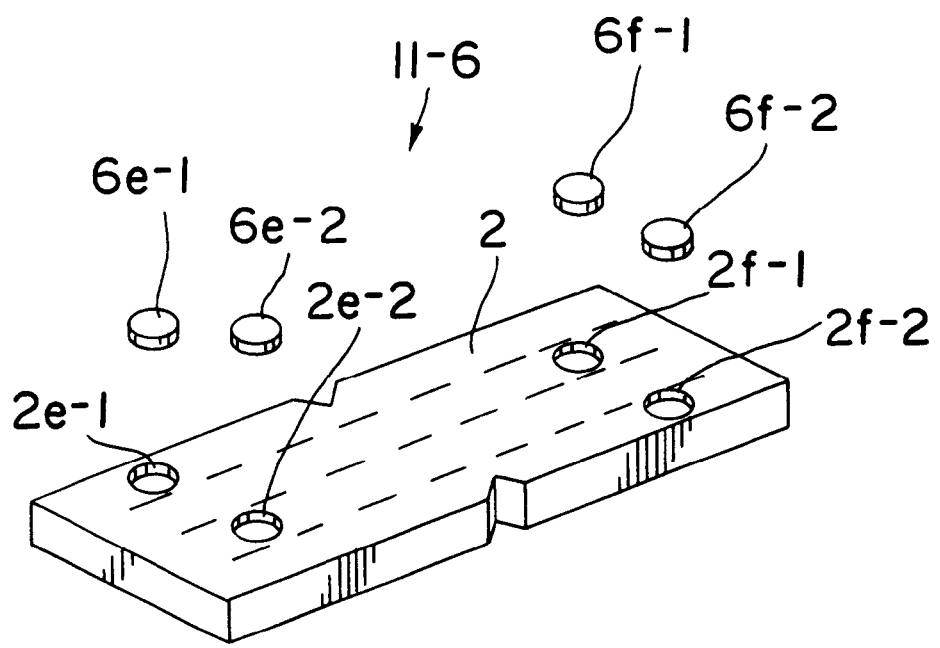
FIG. 8 is an elevated perspective view of a vibration actuator according to a seventh preferred embodiment of the present invention.

FIG. 8 is an elevated perspective view of a vibration actuator according to a seventh preferred embodiment of the present invention. As illustrated, vibration actuator 11-6, according to the seventh preferred embodiment, is similar to the fourth preferred embodiment and does not include driving force output units formed as protrusions on elastic member 2.

In the seventh preferred embodiment, there are two each, for a total of four sliding members 6e-1, 6e-2, 6f-1, 6f-2 mounted at two places close to antinodes of the bending vibration generated in elastic member 2. The four sliding members are located in mutually displaced positions along a short side direction of a second face such that paths of respective sliding members are not superposed in a positional relationship during relative motion.

Each sliding member is formed in a disc shape. Moreover, disc-shaped concave portions 2e-1, 2e-2, 2f-1, 2f-2 are formed in elastic member 2 in a location position of each sliding member. The sliding members are affixed by insertion into these respective concave portions.

By way of the seventh preferred embodiment, the path of sliding member 6e-1, when in relative motion, is not superposed on the path of sliding member 6f-1 when in relative motion. Moreover, the path of sliding member 6e-2, when in relative motion, is not superposed on the path of sliding member 6f-2 when in relative motion. Because of this, even if wear dust is generated on the paths of the sliding members through contact of one sliding member with a relative moving member, other sliding members move on separate paths and are minimally affected by wear dust. As a result, little wear dust adheres to the contact surface of each sliding member and the relative moving member, and the life of the vibration actuator is lengthened.

Furthermore, sliding members 6e-1, 6e-2, 6f-1, 6f-2 may be directly affixed to elastic member 2 without the formation of concave portions 2e-1, 2e-2, 2f-1, 2f-2 in elastic member 2.

Modified Embodiments

In the above preferred embodiments, the material of the sliding members 5a-1, 5b-1 is not limited. From the standpoints of wear resistance, durability, and starting torque, each kind of sliding member can be selected from well known prior art or newly developed sliding members, alone or in combination.

Moreover, in each preferred embodiment, the vibration actuators are preferably ultrasonic actuators, which use a ultrasonic vibration region. However, there is no limitation of the present invention to this mode. Vibration actuators which use other vibration regions can equally be used.

Moreover, in each embodiment, piezoelectric elements have been used as electro-mechanical converting elements. However, there is no limitation to this mode of vibration actuators with which the present invention is concerned. Any means which is capable of converting electrical energy into mechanical energy can equally well be applied. For example, other than piezoelectric elements, electro-strictive elements may be used.

Furthermore, in the first and second embodiments, driving force output units are formed on a whole face of a short side direction of a second face (a face on which driving force output units are formed) of elastic member 2. Then, by disposing sliding members on a portion of a length direction of these driving force output units, the sliding members are mounted on a portion of the short side direction on an elastic member. However, there is no limitation of the present invention to such a mode. For example, a driving force output unit may be formed in a portion of a short side direction of a second face of an elastic member, and in addition, a sliding member may be mounted on a whole face, or a part of a face, of a driving force output unit.

Although a few preferred embodiments of the present invention have been shown and described, it will be appreciated by those skilled in the art that changes may be made in these embodiments without departing from the principles and spirit of the invention, the scope of which is defined in the claims and their equivalents.

What is claimed is:

1. A vibration actuator comprising:
   an elastic member of rectangular parallelepipedal form having a first and second face;

an electro-mechanical converting element mounted to the first face of said elastic member and to generate plural vibrations in said elastic member;

plural driving force output portions formed on the second face of said elastic member and extending in a short side direction of the second face of said elastic member;

a relative moving member in compressive contact with said driving force output portions; and plural sliding members respectively disposed on said driving force output portions such that said sliding members do not fully extend across said driving force output portions in the short side direction.

2. The vibration actuator according to claim 1, wherein said driving force output portions are protrusions from said second face of said elastic member and extending in said short side direction of said second face of said elastic member.

3. The vibration actuator according to claim 1, wherein said sliding members are located in a center portion of said respective driving force output portions in the short side direction.

4. The vibration actuator according to claim 1, wherein said sliding members include first and second sliding members and said driving force output portions include first and second driving force output portions, and said first sliding member is disposed in a center position of said first driving force output portion and said second sliding member is disposed in a center position of said second driving force output portion.

5. The vibration actuator according to claim 1, wherein said plural vibrations include bending vibrations, and said driving force output portions are formed in positions close to antinodes of said bending vibrations.

6. The vibration actuator according to claim 1, wherein said sliding members are attached to said driving force output portions by adhesive.

7. The vibration actuator according to claim 1, wherein said driving force output portions are disposed about two positions along a relative motion direction of said relative moving member with respect to said elastic member, and said sliding members are disposed in positions such that their respective paths are not mutually superposed during relative movement of said relative moving member with respect to said elastic member.

8. The vibration actuator according to claim 1, wherein an elliptic motion is generated in said elastic member in response to the plural vibrations produced by said electro-mechanical converting element, and said sliding members are located in positions in which elliptic motion amplitude becomes approximately equal.

9. A vibration actuator according to claim 1, wherein said sliding members are disposed on first and second ends of each driving force output portion in the short direction.

10. A vibration actuator comprising:

an elastic member having a first face and a second face;

an electro-mechanical converting element attached to the first face of said elastic member to generate elliptic motion in said elastic member;

a relative moving member to move with respect to said elastic member in response to the elliptic motion; and plural sliding members mounted on said elastic member in positions where the amplitude of the elliptic motion becomes approximately equal.

11. The vibration actuator according to claim 10, wherein said electro-mechanical converting element generates the elliptic motion by generating plural vibrations including bending vibrations in said elastic member, and said sliding members are disposed in positions close to antinodes of said bending vibrations.

12. The vibration actuator according to claim 10, wherein said sliding members are attached to said elastic member by adhesive.

13. A vibration actuator, comprising:

an elastic member having a first face and second face, wherein said first and second face extend in a short side direction and a long side direction;

an electro-mechanical converting element mounted on the first face of said elastic member to generate plural vibrations in said elastic member;

a first pair of sliding members extending from the second face of said elastic member and separated in the short side direction;

a second pair of sliding members extending from the second face of said elastic member and separated in the short side direction; and a relative moving member in compressive contact with said first and second pair of sliding members, wherein said second pair of sliding members and a first pair of sliding members are disposed in positions such that their respective path are not mutually superposed during relative movement of said relative moving member with respect to said elastic member.

14. The vibration actuator according to claim 13, wherein said plural vibrations include bending vibrations, and said first and second pair of sliding members are mounted on positions close to antinodes of said bending vibrations.

15. The vibration actuator according to claim 13, wherein said first and second pair of sliding members are attached to said elastic member by adhesive.

* * * * *